(12) United States Patent
Sambucco

(10) Patent No.: US 9,608,607 B2
(45) Date of Patent: Mar. 28, 2017

(54) SPEED BOOSTER FOR COMPARATOR

(71) Applicant: Infineon Technologies Austria AG, Villach (AT)

(72) Inventor: Adriano Sambucco, Lind Villach (AT)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 14/532,323

(22) Filed: Nov. 4, 2014

(65) Prior Publication Data
US 2016/0126940 A1    May 5, 2016

(51) Int. Cl.
*H03L 5/00* (2006.01)
*H03K 5/08* (2006.01)

(52) U.S. Cl.
CPC ..................................... *H03K 5/08* (2013.01)

(58) Field of Classification Search
CPC ............................. H03K 5/2481; H03K 5/08
USPC .......................................................... 327/321
See application file for complete search history.

(56) References Cited

U.S. PATENT DOCUMENTS 4,159,450 A * 6/1979 Hoover ..................... H03F 3/30
                                                                 330/264
2011/0204923 A1* 8/2011 Ochi ................... H03F 3/45183
                                                                  327/52

* cited by examiner

*Primary Examiner* — Lincoln Donovan
*Assistant Examiner* — Metasebia Retebo
(74) *Attorney, Agent, or Firm* — Shumaker & Sieffert, P.A.

(57) ABSTRACT

Representative implementations of devices and techniques provide a speed increase to a comparator circuit. An active clamp device may be positioned between an input stage and an output stage of the comparator, limiting the voltage range of the output of the first stage.

23 Claims, 10 Drawing Sheets

SPEED BOOSTER FOR COMPARATOR

BACKGROUND

High gain and low offset comparators are usually designed with the first gain stage very high. In order to do this, the output of the first gain stage often uses a cascode configuration for the active load.

However, when the inputs of the comparator are not balanced, that is, they are far from the switching point of the comparator, the voltage output of the comparator is either close to the supply or close to the ground. In this state, the output devices of the comparator are pushed close to, or into, the triode region. Since the parasitic capacitances of the output devices (e.g., at the gate-drain (GD)) can be much higher in the linear region than in saturation, the comparator can lose time charging these greater capacitances, reducing the overall speed of the comparator.

Accordingly, comparators designed for high gain and low offset can have a speed limitation when output devices of the first internal stage go into the linear region and the inputs to the comparator are unbalanced. This is particularly true when the output devices of the first gain stage are "cascoded." As a result, the comparators may be slower than desired for some applications.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a boost to the speed of a comparator circuit. In an implementation, an active clamp device (e.g., circuit, component, arrangement, etc.) may be positioned between an input stage and an output stage of the comparator, limiting the voltage range of the output of the input stage.

In an implementation, limiting the voltage range of the output of the input stage maintains the output devices of the input stage in the saturation range. In the implementation, this reduces the parasitic capacitances of the output devices, and reduces the charging time of the parasitic capacitances, thus improving the speed of the comparator. In another example, limiting the voltage range of the output of the input stage limits the voltage amplitude of the output of the input stage, also improving the speed of the comparator.

In one implementation, the active clamp changes its threshold as a function of the state (high or low) of the output of the input stage of the comparator. For example, in the implementations, the active clamp comprises an inverter, which drives a follower in order to clamp the voltage output of the input stage of the comparator. In an implementation, the comparator includes at least a second stage of gain, to compensate for the limits on the input stage.

Various implementations and techniques for increasing a speed of a comparator are discussed in this disclosure. Techniques and devices are discussed with reference to example devices, circuits, and systems illustrated in the figures that use complementary metal-oxide semiconductor (CMOS) transistors, field-effect transistors (FETs) or like components. However, this is not intended to be limiting, and is for ease of discussion and illustrative convenience. The use herein of the term "transistor" is intended to apply to all of various junction-type components, and the like. For example, the techniques and devices discussed may be applied to any of various junction devices (including bipolar junction transistors, diodes, MOSFET devices, etc.), as well as various circuit designs, structures, systems, etc., while remaining within the scope of the disclosure.

Implementations are explained in more detail below using a plurality of examples. Although various implementations and examples are discussed here and below, further implementations and examples may be possible by combining the features and elements of individual implementations and examples.

Example Clamping Technique

Figure 1:
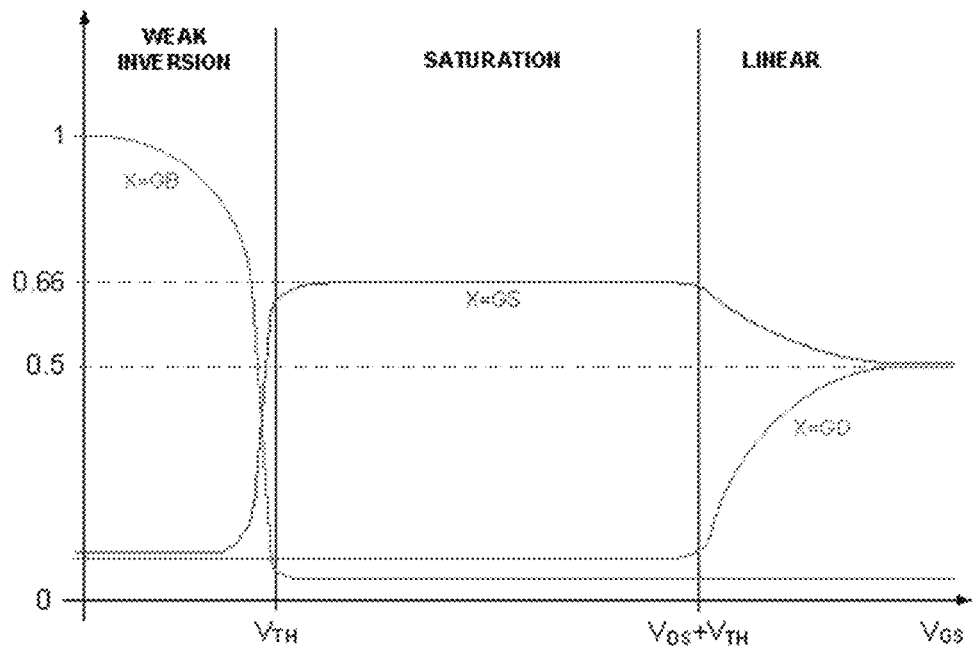
FIG. 1 is a graphical representation showing a capacitance distribution of a transistor device as a function of its operative regions.

Referring to FIG. 1, a graphical representation is shown that illustrates an example capacitance distribution of a transistor device (e.g., a MOS device) as a function of its operative regions. For example the parasitic capacitance of the gate-drain (GD) of the device increases significantly after the device transitions from the saturation region (where the gate-drain capacitance is low) to the linear region of the device (where the gate-drain capacitance is high).

However, when the inputs to a high-gain, low-offset comparator (particularly a comparator that is arranged in a cascade arrangement) are not balanced, that is, they are far from the switching point of the comparator, the output devices of the comparator can be pushed close to, or into, the linear region. The higher capacitances of the output devices operating in the linear region can take much longer to charge, reducing the overall speed of the comparator.

Figure 2:
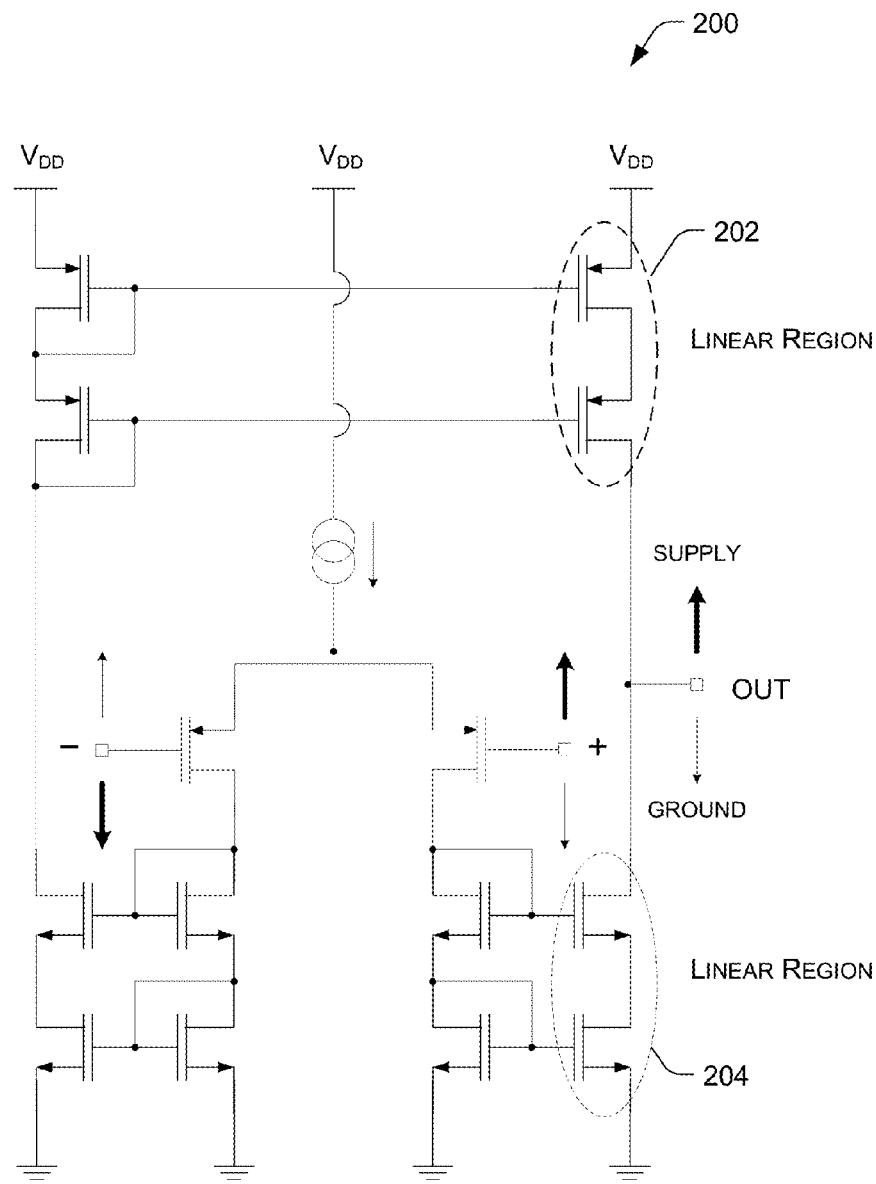
FIG. 2 is a schematic diagram of an example high-gain comparator, having a single-stage topology, according to an implementation.

FIG. 2 is a schematic diagram of an example high-gain comparator 200, having a single-stage topology, according to an implementation. As shown in FIG. 2, when the inputs (+ and −) of the comparator 200 are unbalanced, the voltage at the output (OUT) of the comparator 200 is either close to the supply or close to the ground. In this state, at least one set of the output components (202 and/or 204) are pushed into the linear region, as described above and shown in FIG. 2. Accordingly, the speed of the comparator 200 can be negatively impacted in this state.

In an implementation, in order to increase the speed of the comparator 200, the voltage at the output (OUT) of the comparator 200 is held to be less than the voltage VDD−$2 \cdot V_{DSsat}$ after the comparator 200 switches and the + input is higher than the − input. Also, the voltage at the output (OUT) of the comparator 200 is held to be greater than the voltage $2 \cdot V_{DSsat}$ after the comparator 200 switches and the − input is higher than the + input, where the voltage $V_{DSsat}$ is the saturation voltage, or the voltage resulting in the output devices 202, 204 being in the saturation region, as shown in FIG. 1.

In an implementation, an active clamp 302 is used to limit the voltage range of the output (OUT) to satisfy the above conditions. In an example, the active clamp 302 changes its threshold (e.g., either VDD−$2 \cdot V_{DSsat}$ or $2 \cdot V_{DSsat}$) as a function of the state (either high or low, respectively) of the output (OUT). In the implementation, as shown in FIG. 3, the active clamp 302 is positioned at the output (OUT) of the comparator 200.

Figure 3:
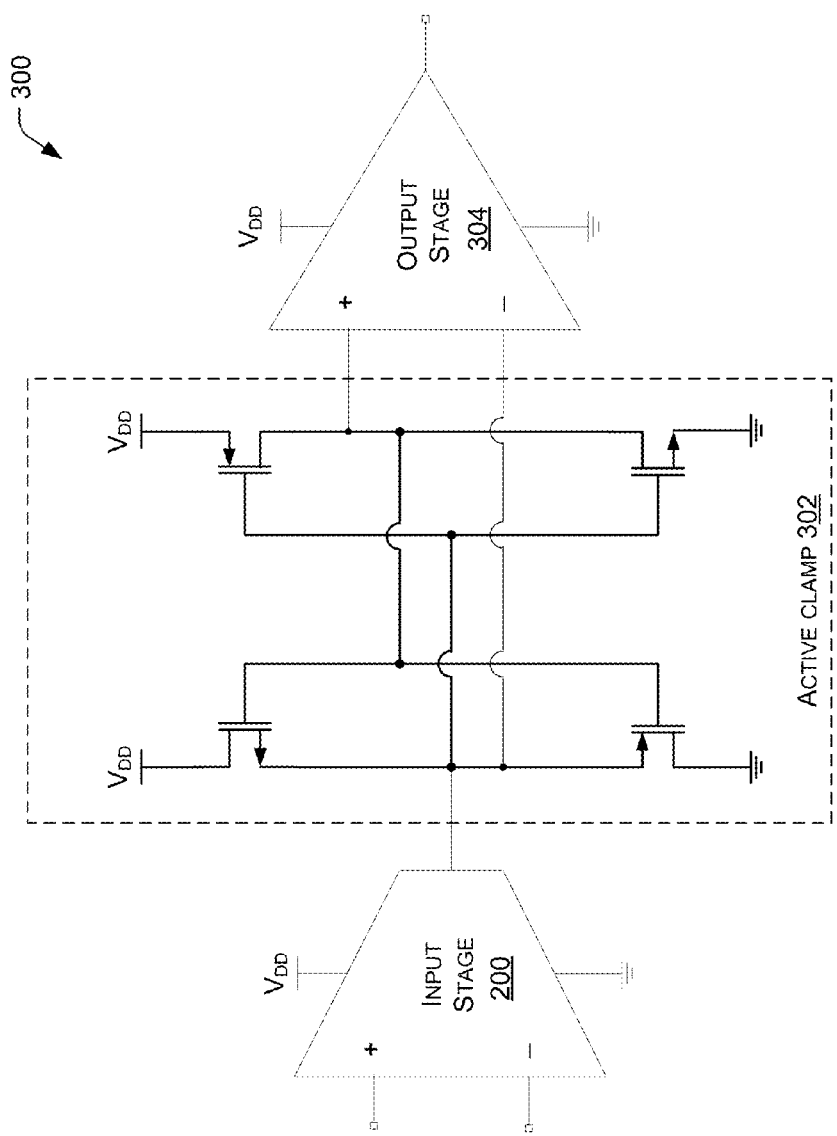
FIG. 3 is a schematic diagram of an example active clamp circuit, arranged between an input stage and an output stage of a comparator, according to an implementation.

Referring to FIG. 3, in an implementation, because the output (Out) of the comparator 200 now has a limited voltage range (due to the active clamp 302 as discussed above), another stage of gain (output stage 304) is added. In the implementation, the single-stage comparator 200 is arranged to comprise an input stage to a multi-stage comparator 300. For example, as shown in FIG. 3, the active clamp circuit 302 is arranged between the input stage 200 and the output stage 304 of the multi-stage comparator 300.

In an implementation, the output stage 304 can be designed to reach the maximum speed of the technology used. For instance, the devices used to implement the output stage 304 can be very small without considering the mismatch of the devices. This is because the gain of the first stage 200, which can be very high, can reduce the mismatch effects to be considered negligible.

Figure 4:
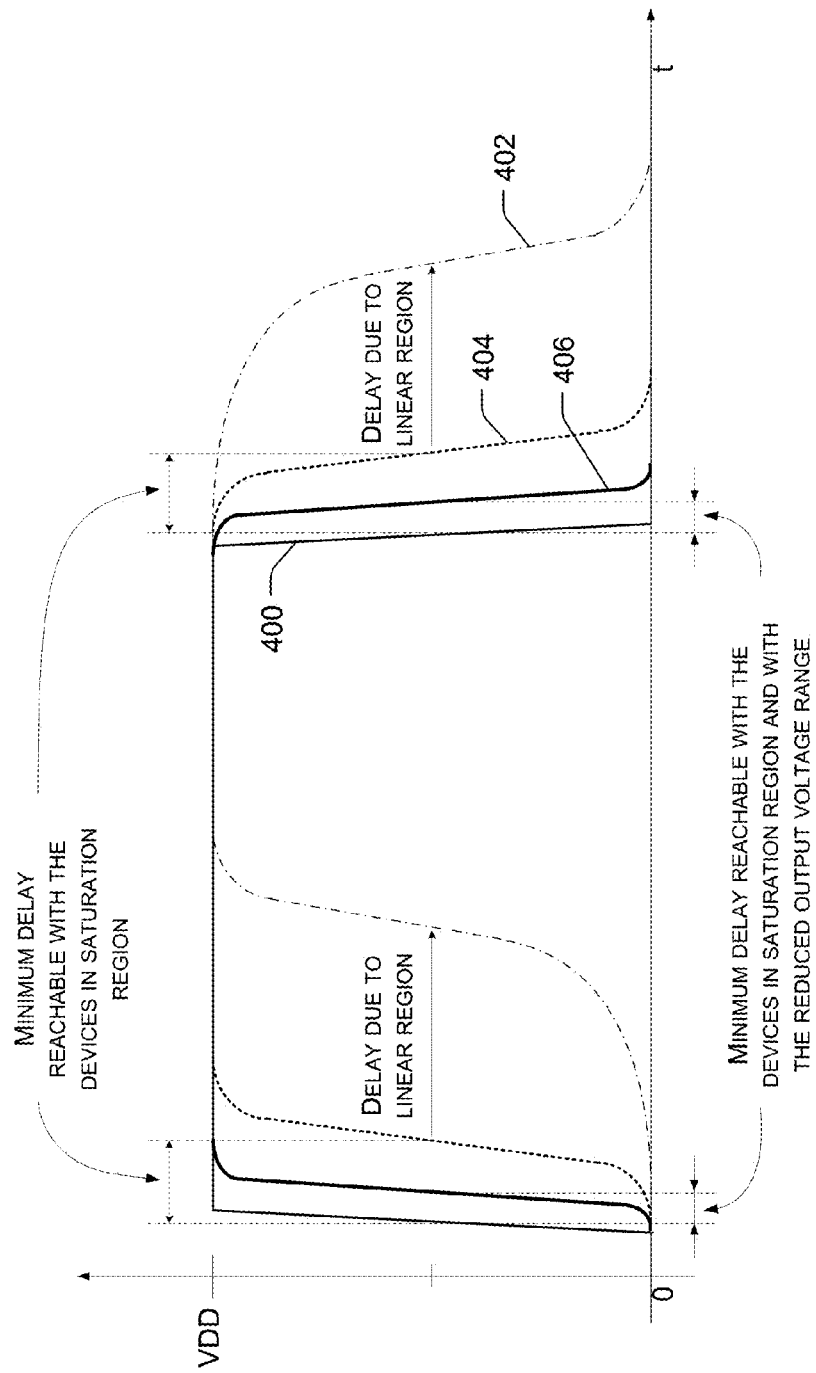
FIG. 4 is a graphical representation of voltage as a function of time on an output transistor device of a comparator, according to an implementation. The graph illustrates three voltage curves for comparison of operational speed of the transistor device, and thus, the comparator.

FIG. 4 is a graphical representation of voltage as a function of time on an output transistor device (202, 204) of a comparator 200, according to an implementation. The graph illustrates three voltage curves for comparison of operational speed of the transistor device (202, 204), and thus, the comparator 200 (e.g., the operating time of the comparator 200 from receiving an input signal to generating an output signal). The supply (VDD) pulse is shown at 400. As shown in FIG. 4, without the application of the clamp device 302 at the output of the comparator (i.e., input stage) 200, there is a delay (shown at 402) due to the output devices 202, 204 of the input stage 200 being in the linear region of operation, and the capacitances at the gate-drain using a longer duration to charge.

In another example, as shown at 404 of FIG. 4, the delay is shortened significantly by maintaining the output devices 202, 204 in the saturation region of operation. Additionally, as shown at 406 of FIG. 4, the delay is shortened still further by reducing the voltage amplitude range at the output of the comparator (i.e., input stage) 200. In an implementation, the active clamp 302 is arranged to maintain the output devices 202, 204 in the saturation region of operation and to reduce (or limit) the voltage amplitude range at the output of the comparator (i.e., input stage) 200.

Example Implementations

Figure 5:
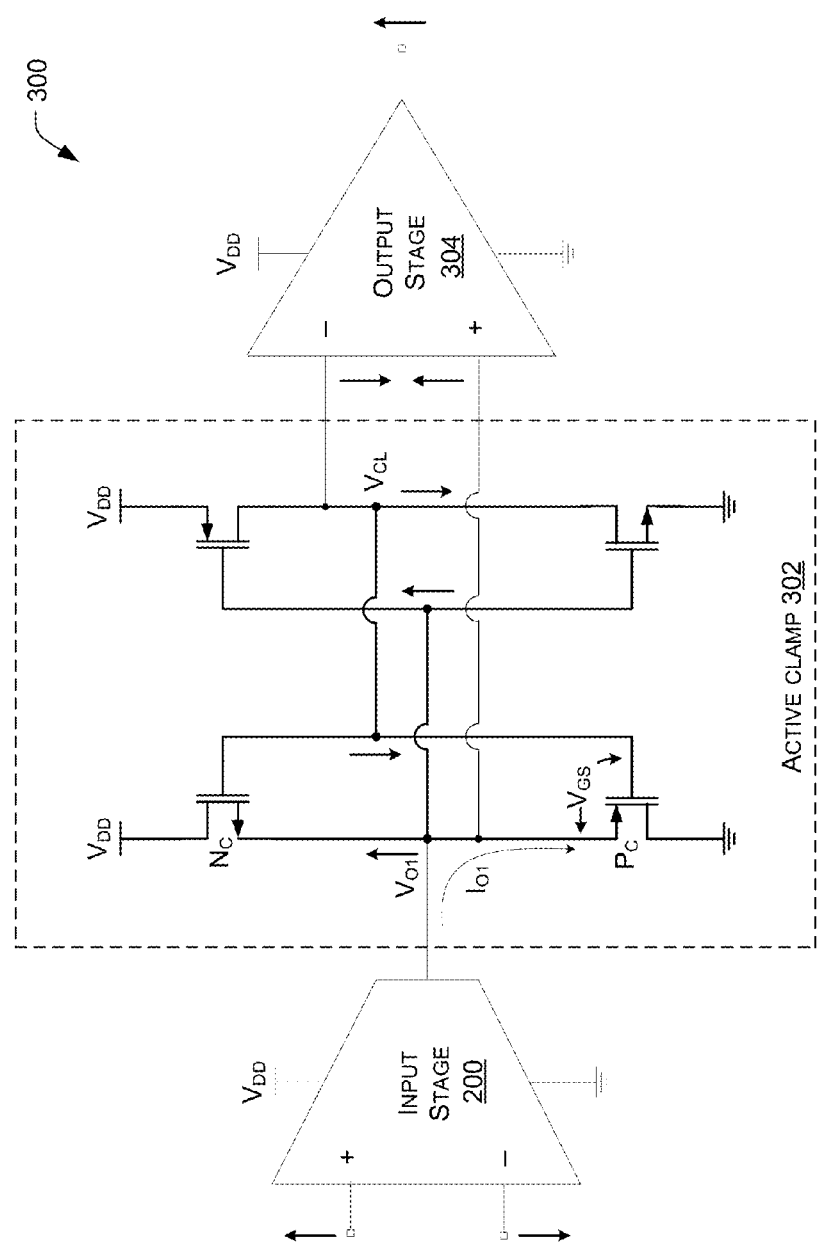
FIG. 5 is a schematic diagram of the example active clamp circuit of FIG. 3, illustrating example voltage and current characteristics, according to an implementation.

FIG. 5 is a schematic diagram of the example comparator 300 of FIG. 3, including the active clamp circuit 302, illustrating example voltage and current characteristics. In an implementation, as shown in FIG. 5, the active clamp 302 is comprised of an inverter circuit. In an example, the inverter is sized to drive a follower in order to clamp the voltage $V_{O1}$ that is output of the input stage 200 of the comparator 300 around the middle supply voltage.

In an implementation, when the inputs of the comparator 300 are far away from the switching point, as illustrated by the arrows at the inputs to the input stage 200 in FIG. 5, the output $V_{O1}$ will go high. If the voltage $V_{O1}$ goes high, the node $V_{CL}$ will go low, and with it also the gate of the p-channel MOS $P_C$. However, the N-channel MOS $N_C$ will be off, because the source will be higher than the gate. In this state, the voltage $V_{O1}$ will find an operating point that satisfies the equation: $V_{O1}=V_{CL}+V_{GS\_P}$, where the voltage $V_{GS\_P}=V_{TH\_P}+V_{od_{IO1}}$, and where $V_{od_{IO1}}$ is the overdrive necessary to sink the current $I_{O1}$.

Figure 6:
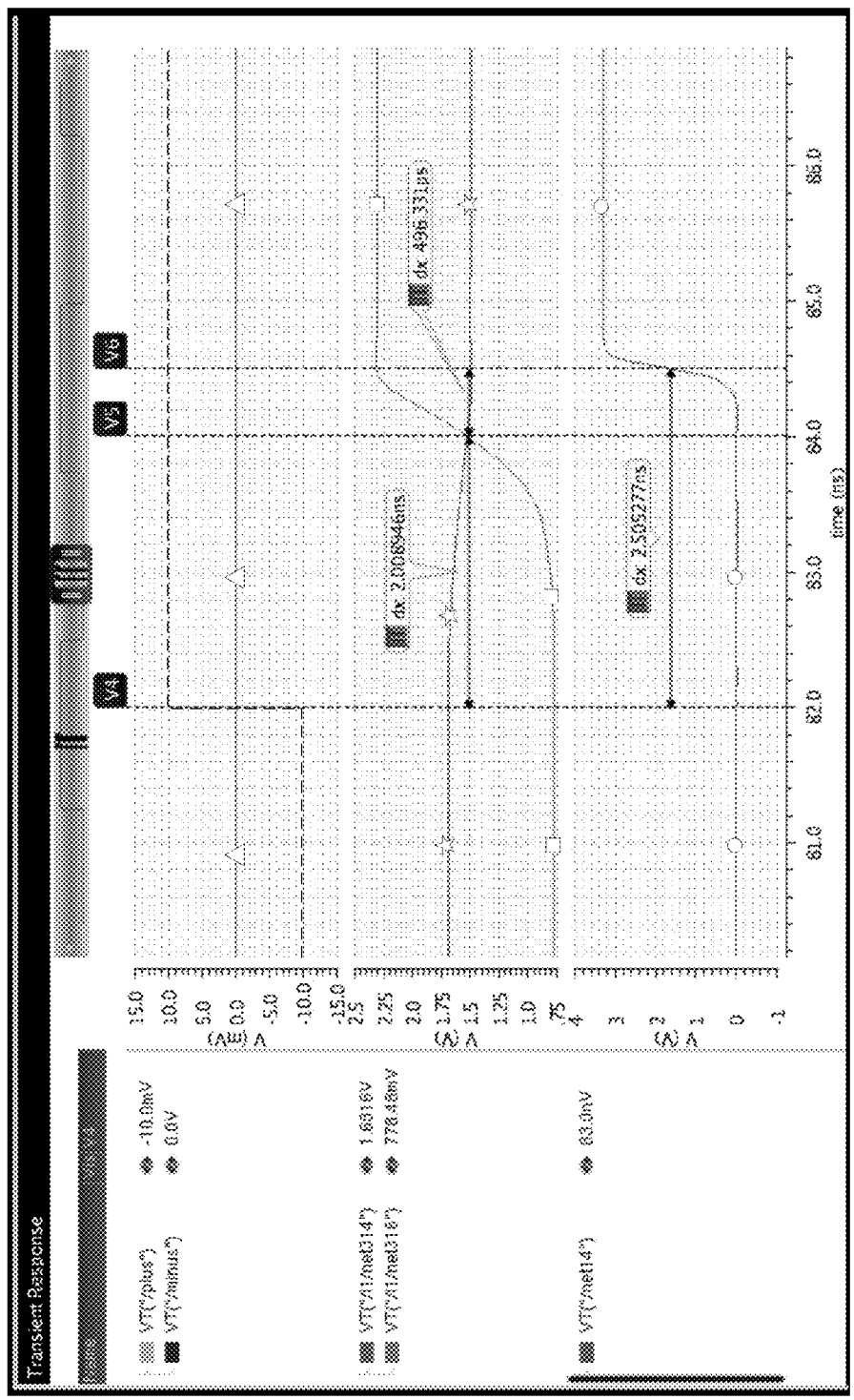
FIG. 6 is a circuit simulation output graph illustrating clamp circuit operation and results, according to various examples.

FIG. 6 is a comparator 300 circuit simulation output graph illustrating clamp 302 circuit operation and results, according to various examples. For example, the small delay time between input and output of the multi-stage comparator 300 that results from the clamp 302 can be viewed graphically.

In the first row of the graph of FIG. 6, are shown the inputs of the multi-stage comparator 300, the plus input shown as a dashed line and the minus input shown with a triangle marker. In the example shown, the difference between inputs is ±10 mV, which is enough, due to the gain (85 dB, for example) of the first stage 200 of multi-stage comparator 300, to have the maximum voltage range on $V_{O1}$. In an implementation, as shown with a star marker in the graph of FIG. 6, the maximum voltage on $V_{O1}$ is clamped to between 1.5 V and 1.75 V, due to the clamp circuit 302. Without the clamp circuit, the maximum voltage on $V_{O1}$ would be allowed to reach from 0 V to 3.3V, which are respectively ground and the voltage supply of the comparator 300.

In the example implementation, the voltage on the node $V_{CL}$ is shown with a square marker in the graph of FIG. 6. In the example, the voltage range is limited due to the relationship discussed above: $V_{O1}=V_{CL}+V_{GS\_P}$. Thus, operation in the linear region is also avoided for the inverter components, which is of benefit to the speed of the comparator 300.

As a result of the operation of the active clamp 302, and including operating the inverter components in the saturation region, the delay of the first stage 200 is about 2 ns. In terms of comparator 300 speed, that is considered an excellent result (see FIG. 4), considering that the sizes of the clamp 302 devices typically have a systematic offset of <120 μV and a random offset at 6 sigma of <7.5 mV.

The second gain stage 304 can be designed very small and speed oriented. For example, while the first gain stage 200 is at a high gain and a low offset, in the example shown in FIG. 6, the second gain stage 304 introduces a delay of 500 ps. This brings the total delay time between input and output of the multi-stage comparator 300 to 2.5 ns, as shown with the line having circle markers in the graph at FIG. 6. In an implementation, for the purpose of generating the graph of FIG. 6, the output of the multi-stage comparator 300 is loaded with an inverter, as a simulation of a real application of the multi-stage comparator 300.

Figure 7:
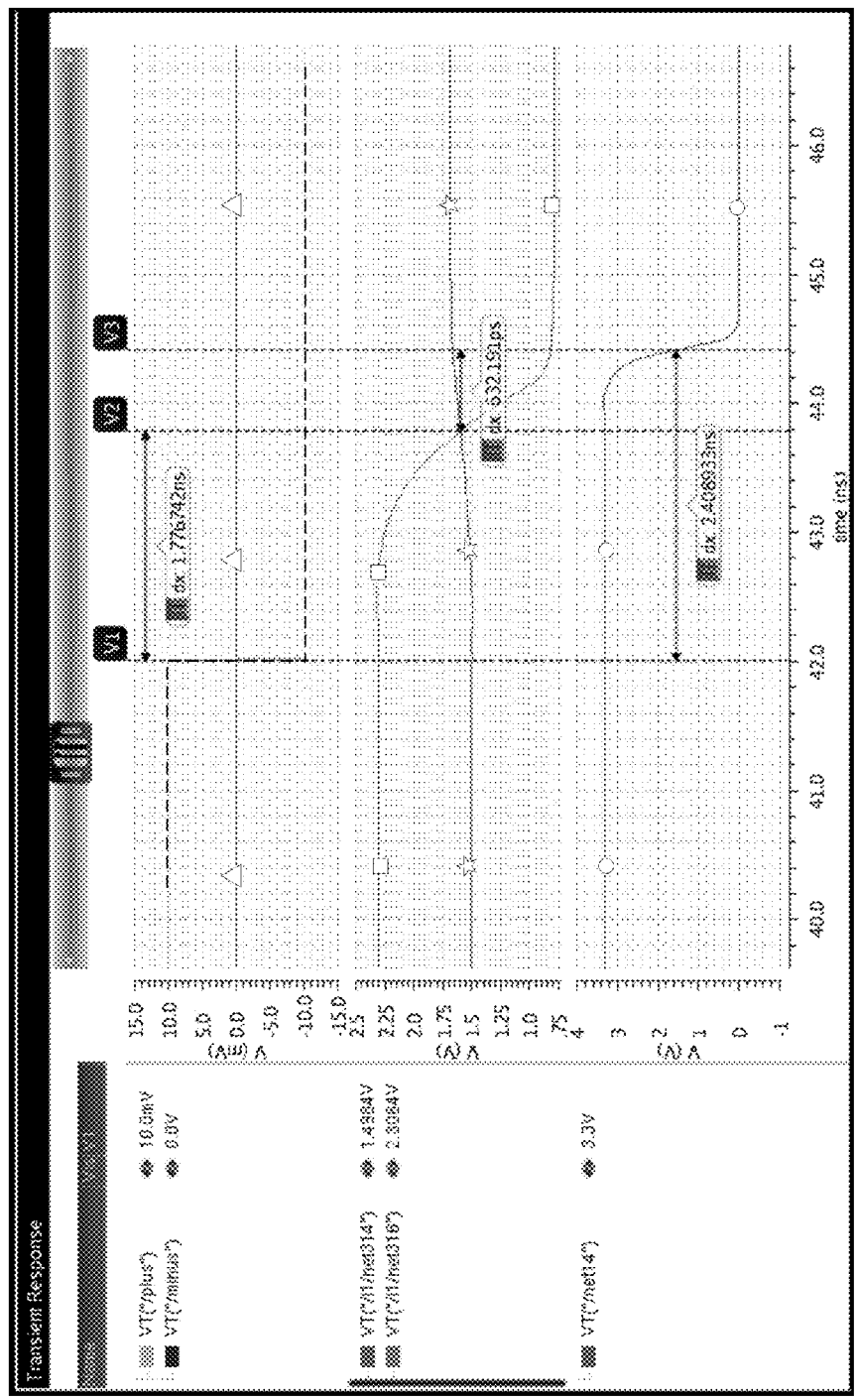
FIG. 7 is another circuit simulation output graph illustrating clamp circuit operation and results, this time with reversed polarity, according to various examples.

As an additional illustration, FIG. 7 shows another comparator 300 circuit simulation output graph illustrating the clamp 302 circuit operation and results, this time with reversed polarity of inputs (e.g., transition of the positive input from high to low). As a result of the clamp 302, including the operating range of the inverter components, the delay of the first stage 200 is about 1.8 ns (as shown in FIG. 7). Additionally, the fast second stage 304 introduces a delay of about 632 ps. This brings the total delay time between input and output of the multi-stage comparator 300 to 2.4 ns, as shown with the line having circle markers in the graph at FIG. 7.

Figure 8:
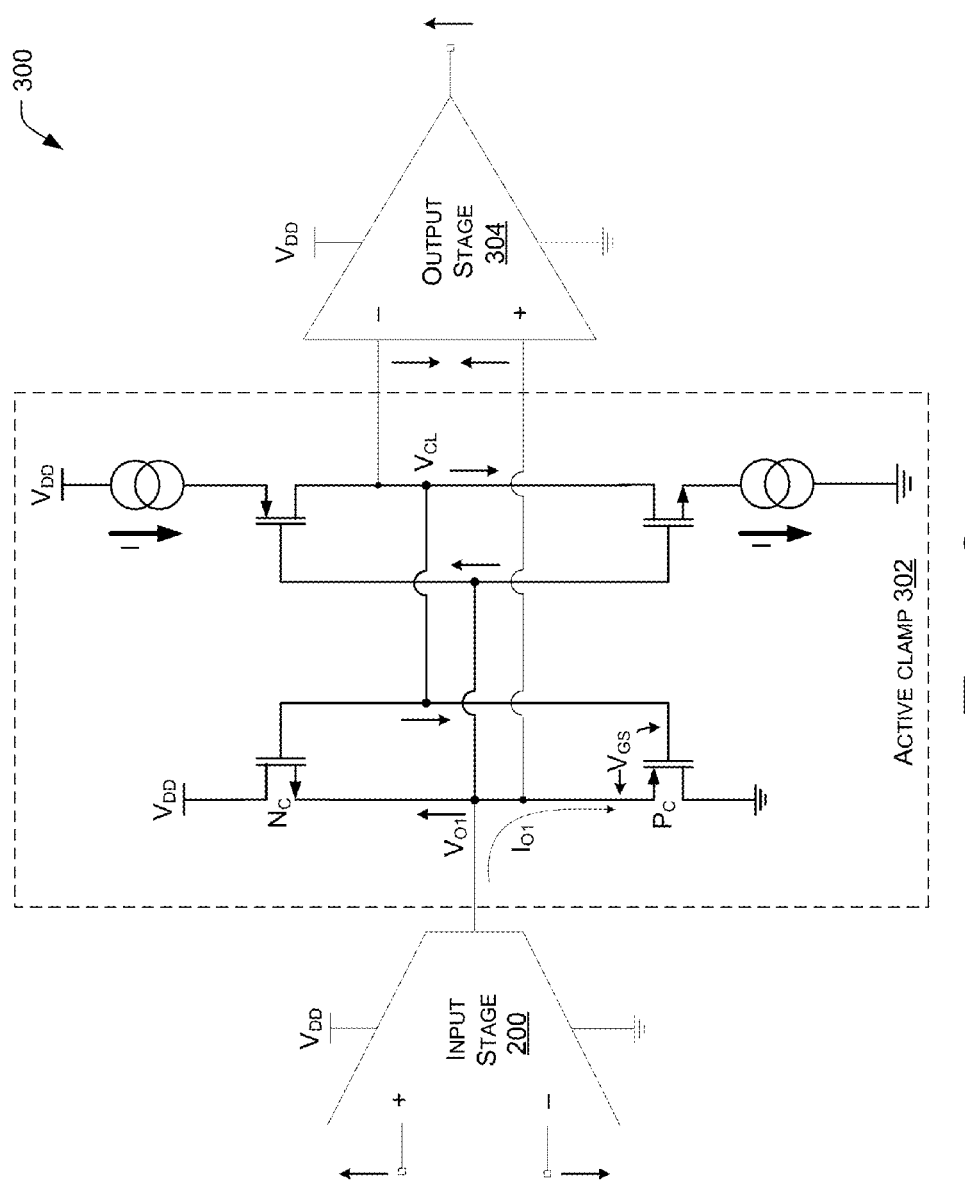
FIG. 8 is a schematic diagram of another example active clamp circuit, arranged between an input stage and an output stage of a comparator and including one or more current generators, according to an implementation.

FIG. 8 is a schematic diagram of another implementation of the comparator 300 of FIG. 3, including the active clamp circuit 302, arranged between the input stage 200 and the output stage 304. In the implementation, current control is provided for the inverter, for example, while the input to the inverter is close to the half voltage supply. In one example, current generators may be located between the source of the p-channel transistor and the voltage supply (VDD) and/or the source of the n-channel transistor and the ground, as shown in FIG. 8. In alternate implementations, current control may be provided using other techniques, devices, or the like.

Figure 9:
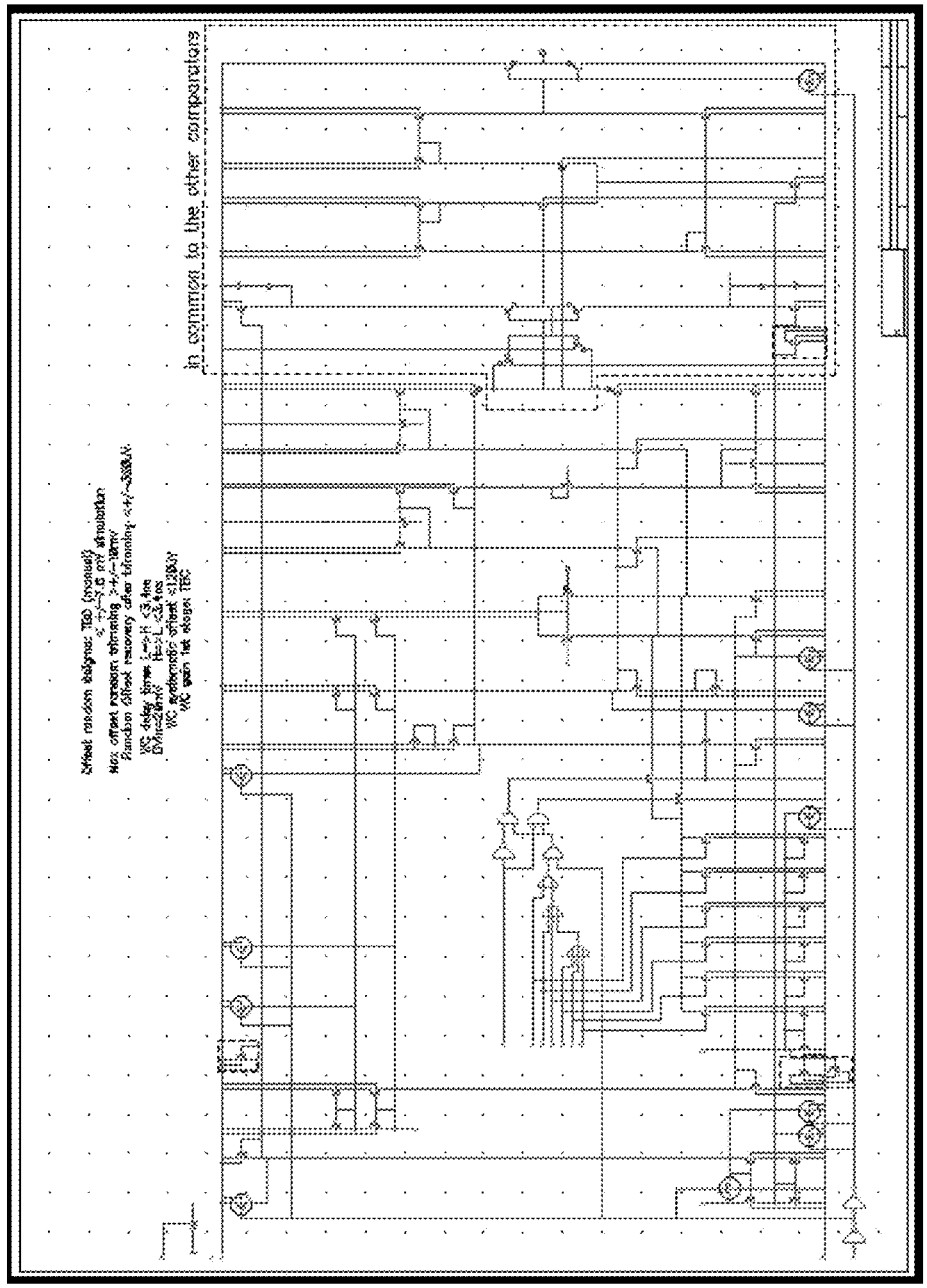
FIG. 9 is a circuit diagram of an example comparator layout, according to an example.

FIG. 9 is a circuit diagram of an example multi-stage comparator 300 layout, according to an example. In alternate implementations, a multi-stage comparator 300 and/or an active clamp circuit 302 may be arranged in various other layouts, while fulfilling the functions as described, according to various associated techniques.

The techniques, components, and devices described herein with respect to the example multi-stage comparator 300 and/or the active clamp 302 are not limited to the illustrations of FIGS. 2-9, and may be applied to other circuits, structures, devices, and designs without departing from the scope of the disclosure. In some cases, additional or alternative components may be used to implement the techniques described herein. Further, the components may be arranged and/or combined in various combinations, while remaining within the scope of the disclosure. It is to be understood that a multi-stage comparator 300 having an active clamp 302, or the like, may be implemented as a stand-alone device or as part of another system (e.g., integrated with other components, systems, etc.).

Representative Process

Figure 10:
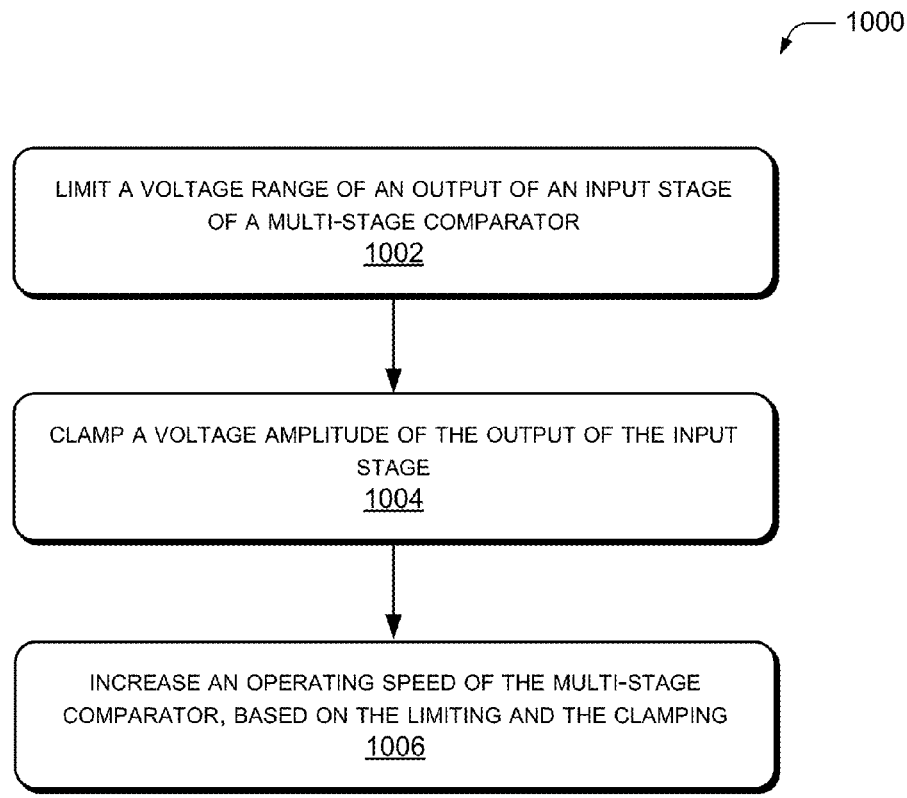
FIG. 10 is a flow diagram illustrating an example process for boosting the speed of a comparator, according to an implementation.

FIG. 10 is a flow diagram illustrating an example process 1000 for improving a speed of a comparator, according to an implementation. The process 1000 describes using an active clamp circuit (such as clamp circuit 302, for example) to limit a voltage range of an output of an input stage (such as input stage 200, for example) of a comparator (such as comparator 300, for example). The process 1000 is described with reference to FIGS. 1-9.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 1002, the process includes limiting a voltage range of an output of an input stage (such as input stage 200, for example) of a multi-stage comparator (such as comparator 300, for example). In an implementation, the process includes coupling an active clamp device (such as clamp circuit 302, for example) between the output of the input stage and an input of an output stage (such as output stage 304, for example) of the multi-stage comparator and limiting the voltage range of the output of the input stage via the active clamp device.

In an implementation, the process includes maintaining output devices (such as output devices 202, 204, for example) of the input stage in a saturation region of operation based on limiting the voltage range of the output of the input stage. In another implementation, the process includes compensating for the limiting of the voltage range of the output of the input stage by coupling the output stage to the multi-stage comparator, where the output stage has at least a second stage of gain.

At block 1004, the process includes clamping a voltage amplitude of the output of the input stage. In an implementation, the process includes maintaining the output devices of the output of the input stage in a saturation region of operation. In one example, clamping the voltage amplitude of the output of the input stage maintains the output devices of the output of the input stage in the saturation region of operation. In an implementation, the process includes avoiding the operation of transistor components of the active clamp device (such as inverter components, for example) in a linear range of operation.

At block 1006, the process includes increasing an operating speed of the multi-stage comparator, based on the limiting of block 1002 and the clamping of block 1004.

In an implementation, the process includes reducing an operational delay of the multi-stage comparator by maintaining the output devices in the saturation region of operation. In the implementation, the process includes reducing parasitic capacitances of the output devices, decreasing charging time of the parasitic capacitances, and increasing a speed of the multi-stage comparator based on the reducing and decreasing.

In an implementation, the process includes cascoding the output devices of the output of the input stage and operating the input stage in a high-gain and low-offset state. The process includes increasing a speed of operation of the multi-stage comparator by maintaining the output devices in a saturation region of operation while inputs to the multi-stage comparator are unbalanced.

In alternate implementations, other techniques may be included in the process in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   a first pair of transistor devices having a common source and a common gate; and
   a second pair of transistor devices having a common drain and a common gate, the common gate of the first pair of transistor devices being coupled to the common drain of the second pair of transistor devices and the common gate of the second pair of transistor devices being coupled to the common source of the first pair of transistor devices, the apparatus arranged to limit a voltage range of a single-ended output of a first stage of a comparator and to provide a differential input to a second stage of the comparator.

2. The apparatus of claim 1, wherein the first pair of transistor devices comprises a follower circuit and the second pair of transistor devices comprises an inverter.

3. The apparatus of claim 1, wherein the common source of the first pair of transistor devices is coupled to the output of the first stage of the comparator.

4. The apparatus of claim 1, wherein the differential input to the second stage of the comparator comprises the common source of the first pair of transistor devices and the common drain of the second pair of transistor devices.

5. The apparatus of claim 1, wherein the apparatus is arranged to increase a speed of operation of the comparator based on limiting the voltage range of the output of the first stage of the comparator.

6. An electrical circuit, comprising:
   an input comparator stage;
   an output comparator stage; and
   an active clamp device coupled between the input comparator stage and the output comparator stage and arranged to limit a voltage range of a single-ended output of the input comparator stage and to provide a differential input to the output comparator stage.

7. The electrical circuit of claim 6, further comprising one or more current generators coupled between a source terminal of a p-channel transistor of the active clamp device and a voltage supply of the electrical circuit and/or a source terminal of an n-channel transistor of the active clamp device and a ground, the current generators arranged to provide current control for the active clamp device.

8. The electrical circuit of claim 6, wherein the input comparator stage is arranged with a high gain and an output of the input comparator stage is arranged in a cascade configuration.

9. The electrical circuit of claim 8, wherein a speed of operation of the input comparator stage is increased when inputs to the input comparator stage are unbalanced, based on the active clamp device.

10. The electrical circuit of claim 6, wherein the active clamp device changes its threshold as a function of a high state or a low state of the output of the input comparator stage.

11. The electrical circuit of claim 6, wherein the active clamp device comprises an inverter that drives a follower, and is arranged to clamp a voltage output of the input comparator stage to maintain output devices of the input comparator stage to operation within a saturation region of the output devices.

12. The electrical circuit of claim 6, wherein the electrical circuit comprises a multistage comparator having a high gain and a low offset, and a speed of operation of the electrical circuit from receiving an input to generating an output is approximately 2.5 ns or less while the electrical circuit has differential inputs at opposite extremes of an input voltage range.

13. A method, comprising:
   limiting a voltage range of a single-ended output of an input stage of a multi-stage comparator;
   clamping a voltage amplitude of the single-ended output of the input stage; and
   increasing an operating speed of the multi-stage comparator, based on the limiting and the clamping.

14. The method of claim 13, further comprising maintaining output devices of the output of the input stage in a saturation region of operation.

15. The method of claim 13, further comprising coupling an active clamp device between the output of the input stage and an input of an output stage of the multi-stage comparator and limiting the voltage range of the output of the input stage via the active clamp device.

16. The method of claim 15, further comprising avoiding operation of transistor components of the active clamp device in a linear range of operation.

17. The method of claim 13, further comprising compensating for the limiting of the voltage range of the output of the input stage by coupling an output stage to the multi-stage comparator having at least a second stage of gain.

18. The method of claim 13, further comprising maintaining output devices of the input stage in a saturation region of operation based on limiting the voltage range of the output of the input stage.

19. The method of claim 18, further comprising reducing parasitic capacitances of the output devices, decreasing charging time of the parasitic capacitances, and increasing a speed of the multi-stage comparator based on the reducing and decreasing.

20. The method of claim 18, further comprising reducing an operational delay of the multi-stage comparator by maintaining the output devices in the saturation region of operation.

21. The method of claim 18, further comprising cascoding the output devices and operating the input stage in a high-gain and low-offset state, and increasing a speed of operation of the multi-stage comparator by maintaining the output devices in a saturation region of operation while inputs to the multi-stage comparator are unbalanced.

22. A multi-stage comparator circuit, comprising:
   a high-gain and low-offset input comparator stage having output devices arranged in a cascaded configuration;
   a output comparator stage arranged to supplement comparator circuit gain; and
   an active clamp device comprising an inverter, coupled between the input comparator stage and the output comparator stage and arranged to limit a voltage range of a single-ended output of the input comparator stage and to provide a differential input to the output comparator stage.

23. The multi-stage comparator circuit of claim 22, wherein the active clamp device is arranged to maintain the output devices in a saturation region of operation and to limit a voltage amplitude of an output voltage of the input comparator stage.

* * * * *